(12) United States Patent
Chen et al.

(10) Patent No.: US 11,282,874 B2
(45) Date of Patent: Mar. 22, 2022

(54) GLOBAL SHUTTER CMOS IMAGE SENSOR HAVING PHOTOSENSITIVE DOPED REGION WITH INHOMOGENEOUS POTENTIALS

(71) Applicant: Shanghai Huali Microelectronics Corporation, Shanghai (CN)

(72) Inventors: Haoyu Chen, Shanghai (CN); Zhi Tian, Shanghai (CN); Qiwei Wang, Shanghai (CN); Hua Shao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 75 days.

(21) Appl. No.: 16/692,832

(22) Filed: Nov. 22, 2019

(65) Prior Publication Data
US 2020/0357831 A1 Nov. 12, 2020

(30) Foreign Application Priority Data
May 9, 2019 (CN) .......................... 201910382534.8

(51) Int. Cl.
*H01L 27/146* (2006.01)
(52) U.S. Cl.
CPC ...... *H01L 27/1461* (2013.01); *H01L 27/1463* (2013.01); *H01L 27/14612* (2013.01); *H01L 27/14643* (2013.01)
(58) Field of Classification Search
CPC .. H04N 5/3559; H04N 5/37452; H04N 5/374; H01L 27/1461; H01L 27/1463;
(Continued)

(56) References Cited

U.S. PATENT DOCUMENTS

2009/0284632 A1\* 11/2009 Onuki ............... H01L 27/14609
348/302
2018/0213167 A1 7/2018 Miki et al.

FOREIGN PATENT DOCUMENTS

CN 102315237 A \* 1/2012
CN 102315237 A 1/2012
(Continued)

OTHER PUBLICATIONS

Jan. 28, 2021—(CN) CNIPA First Search Report Appn 201910382534.8.

*Primary Examiner* — Nelson Garces
(74) *Attorney, Agent, or Firm* — Banner & Witcoff, Ltd.

(57) ABSTRACT

The invention discloses a global shutter CMOS image sensor. Each pixel unit of the global shutter CMOS image sensor includes a photo diode, a storage region and a first reset region, wherein the photo diode includes a first photosensitive doped region; a gate structure of a first transfer transistor is formed between the storage region and the first photosensitive doped region; a gate structure of a global shutter transistor is formed between the first reset region and the first photosensitive doped region; and inhomogeneous potentials are formed in the first photosensitive doped region through a doping structure. According to the invention, photo-induced carriers in the PDs of the pixel units, especially photo-induced carriers in the PDs of large pixel units, can be simultaneously and completely transferred to the storage region and the first reset region, and the overall performance of the device is improved.

15 Claims, 4 Drawing Sheets

(58) Field of Classification Search
CPC ......... H01L 27/14607; H01L 27/14609; H01L 27/14612; H01L 27/14614; H01L 27/14616; H01L 27/14632; H01L 27/14638; H01L 27/14641; H01L 27/14643; H01L 27/14683; H01L 27/14689

See application file for complete search history.

(56) References Cited

FOREIGN PATENT DOCUMENTS

| | | |
|---|---|---|
| CN | 104347649 A | 2/2015 |
| CN | 105655363 A | 6/2016 |

\* cited by examiner

GLOBAL SHUTTER CMOS IMAGE SENSOR HAVING PHOTOSENSITIVE DOPED REGION WITH INHOMOGENEOUS POTENTIALS

CROSS REFERENCE TO RELATED APPLICATIONS

The present application claims priority to and the benefit of Chinese Patent Application No. 201910382534.8 filed on May 9, 2019, the disclosure of which is incorporated herein by reference in its entirety as part of the present application.

BACKGROUND

The invention relates to semiconductor integrated circuits, in particular to a Global Shutter (GS) CMOS Image Sensor (CIS).

With the development of the automobile industry, the Internet of Things and monitoring equipment, image sensors are being used more and more widely. The CMOS image sensor technology compatible with the CMOS process is the main image sensor technology at present. On the one hand, the pixels are becoming smaller and smaller, so that there can be more pixel units in the unit area to acquire more real images; and on the other hand, the pixels are becoming larger and larger to satisfy special requirements such as broader dynamic ranges and more image details.

Different designs and different processes should be adopted to satisfy different requirements. As for small pixel units each having fewer charges and including more pixel units in one row, faster photo-responses and higher transfer velocities are needed to realize operations on high pixel units. As for large pixel units capable of storing more electrons, the pixel units need to be accurately adjusted to make sure that the electrons in each unit can be completely transferred.

Nowadays, the image sensors are classified more and more precisely, and for different purposes, the image sensors are designed in different ways, and the pixel units are optimized in different ways, wherein in order to meet the requirements for high-velocity shooting in the fields of traffic monitoring, mechanical registration, and so on, the electronic shutter-based global shutter photographing technology is applied at present. According to the global shutter photographing technology, all images are simultaneously scanned instead of being progressively scanned, so that high-velocity images without distortions are obtained. In the prior art, this technology is mainly applied to small pixel units to fulfill complete transfer of photo-induced carriers, such as electrons, from a Photo Diode (PD) region to a Storage Card (SD) or a reset region. In order to apply a global shutter to large pixel units, the following two problems need to be solved: the electrons should be completely transferred from PD to SD, which can be fulfilled with reference to the optimization of an existing structure from PD to SD; and meanwhile, as for the global shutters, the electrons should be transferred from PD to a reset point to provide a good foundation for the next photo-response. However, according to the existing structure, electrons from PD can be transferred in only one direction, while the electrons from PD can be transferred in another direction slowly, or cannot be transmitted in another direction.

Figure 1:
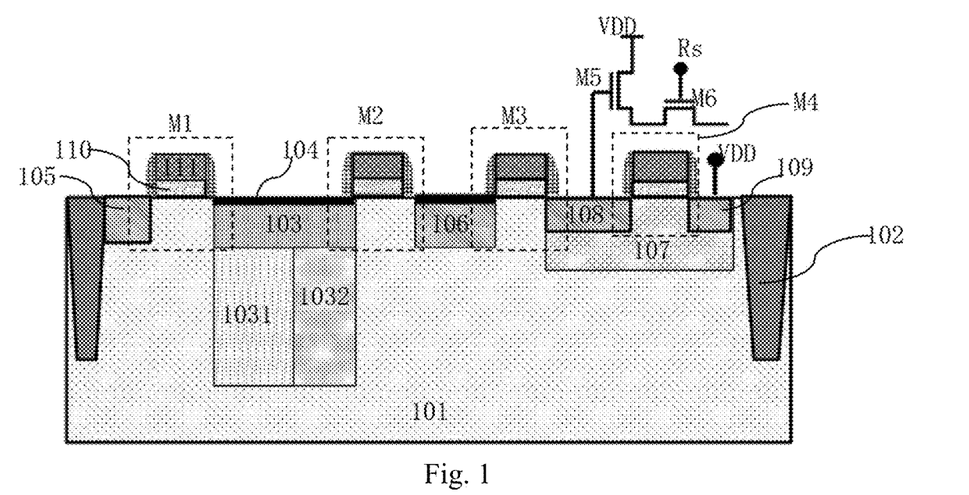
FIG. 1 is a circuit diagram of a pixel unit of an existing 6T global shutter CMOS image sensor.

FIG. 1 is a circuit diagram of a pixel unit of an existing 6T global shutter CMOS image sensor. As shown in FIG. 1, each pixel unit of the existing global shutter CMOS image sensor includes a photodiode, a storage region 106 and a first reset region 105.

The photo diode includes a semiconductor layer 101 of a second conduction type and a first photosensitive doped region 103 which is of a first conduction type and is formed at the top of the semiconductor layer, wherein the semiconductor layer 101 is a silicon layer, and the first photosensitive doped region 103 is an ion implantation region. In FIG. 1, the first photosensitive doped region 103 has a bottom provided with doped regions 1031 and 1032 of the first conduction type, and the doping concentration of the doped region 1032 is higher than that of the doped region 1031 and is lower than that of the first photosensitive doped region 103.

The storage region 106 is doped by the first conduction type, and a gate structure of a first transfer transistor M2 is formed at the top of the semiconductor layer 101 between the first photosensitive doped region 103 and the storage region 106 by superimposition of a gate dielectric layer 110 and a polysilicon gate 111.

The first reset region 105 is doped by the first conduction type and is connected to a supply voltage VDD, and a gate structure of a global shutter transistor M1 is formed at the top of the semiconductor layer 101 between the first photosensitive doped region 103 and the first reset region 105.

A pinned layer 104 doped by the second conduction type is formed on the surface of the first photosensitive doped region 103.

Each pixel unit of the CMOS image sensor further includes a Floating Diffusion (FD) region 108, and a gate structure of a second transfer transistor M3 is formed at the top of the semiconductor layer 101 between the floating diffusion region 108 and the storage region 106.

Each pixel unit of the CMOS image sensor further includes a reset transistor M4 having a gate structure arranged between the floating diffusion region 108 and a second reset region 109, and the second reset region 109 is doped by the first conduction type and is connected to the supply voltage VDD; and the floating diffusion region 108 and the second reset region are formed in a well 107 of the second conduction type.

Generally, the first conduction type is an N type, and the second conduction type is a P type. Or, the first conduction type is the P type, and the second conduction type is the N type.

Each pixel unit of the CMOS image sensor further includes an amplifier transistor M5 and a selection transistor M6, wherein the amplifier transistor M5 has a gate connected to the floating diffusion region 108, a source outputting amplified signals, and a drain connected to the supply voltage VDD; and the selection transistor M6 is used for selectively outputting the amplified signals from the amplifier transistor M5 and has a gate connected to a reference signal Rs.

The pixel units of the CMOS image sensor are surrounded by a shallow trench isolation structure 102.

For instance, if the first conduction type is the N type and the second conduction type is the P type, the pixel unit circuit of the existing 6T global shutter CMOS image sensor is sequentially operated as follows:

(1) A light enters the PD to generate photo-induced carriers, and photoelectrons enter the first photosensitive doped region 103 of the PD;

(2) The first transfer transistor M2 is turned on so that charges of all the pixel units are transferred from the first photosensitive doped region 103 to the SD 106;

(3) The first transfer transistor M2 is turned off so that the photoelectrons are retained in the SD 106;

(4) A gate, namely the gate structure, of the global shutter transistor M1 connected to the PD is turned on, so that the charges left in the first photosensitive doped region 103 of the PD are transferred to the first reset region 105, and extra photoreception-induced photoelectrons are avoided; and (5) The charges are read row by row from the SD 106 through the second transfer transistor M3 and the floating diffusion region 108.

Figure 2A:
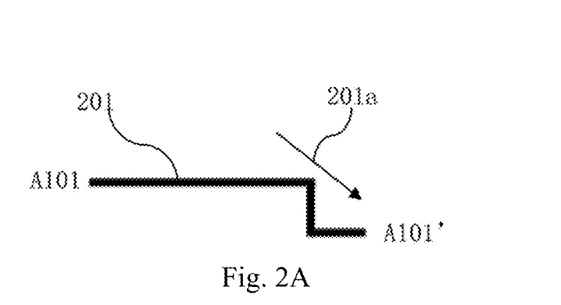
FIG. 2A is a schematic diagram of a small pixel, from a photo diode to a floating diffusion region, of an existing CMOS image sensor not adopting a global shutter.

The existing structure shown in FIG. 1 has the following technical problem: when the existing structure is applied to large pixel units, the charges cannot be completely transferred from a PD node, namely the first photosensitive doped region 103, to the first reset region 105 in the presence of an electric field deviating towards the SD 106, and consequentially, the overall performance of the existing structure is affected. The explanation is as follows:

1. For small pixel units: FIG. 2A is a schematic diagram of the small pixel unit, from the photo diode to the floating diffusion region, of an existing CMOS image sensor not adopting a global shutter; and as shown in FIG. 2A, the small pixel unit of the existing CMOS image sensor not adopting a global shutter does not have the corresponding first reset region 105 or the corresponding global shutter transistor M1 in FIG. 1 and omits the SD 106 and the first transfer transistor M2. Due to the fact that the pixel units are small, internal potentials are affected when the second transfer transistor M3 is turned on, potentials from the PD to the FD region 108 can be formed to facilitate electron transfer.

An energy level distribution curve 201 along line A101A101' is shown in FIG. 2A, wherein energy levels and potentials are correspondingly distributed, particularly, low potentials are distributed at positions having high energy levels, and high potentials are distributed at positions having low energy levels; arrow line 201a of curve 201 shows that the potentials from the first photosensitive doped region 103 of the PD to the FD region 108 are formed and facilitate electron transfer.

Figure 2B:
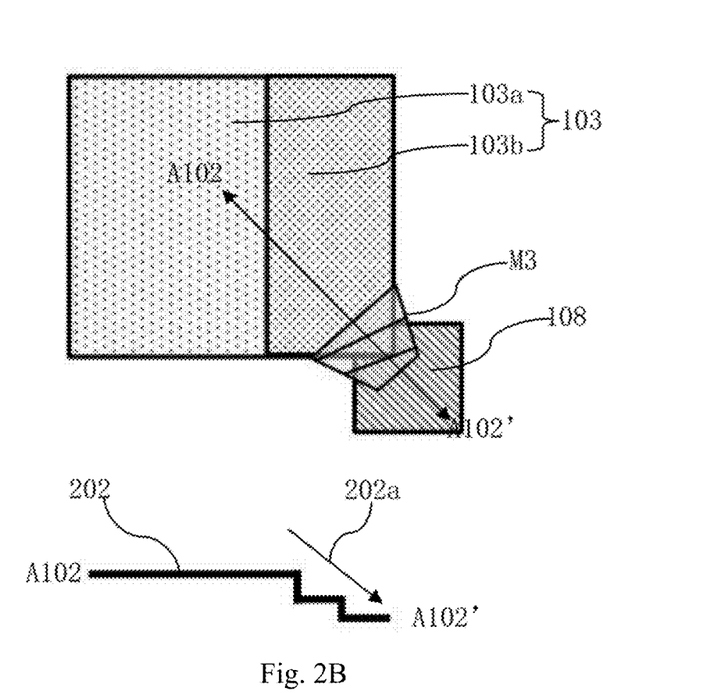
FIG. 2B is a schematic diagram of a large pixel unit, from a photo diode to a floating diffusion region, of an existing CMOS image sensor not adopting a global shutter.

2. For large pixel units: FIG. 2B is a schematic diagram of the large pixel unit, from the photo diode to the floating diffusion region, of the existing CMOS image sensor not adopting a global shutter; compared with FIG. 2A, the first photosensitive doped region 103 of the photo diode of the large pixel unit in FIG. 2B has a larger size, and the floating diffusion region 103 has a large area and is less affected when the second transfer transistor M3 is turned on; and a deep potential well is likely to be generated at the center of the large-area PD and restrains electron transfer. According to certain improvement measures, concentration differences between different regions are adopted to form potentials towards the second transfer transistor M3 to fulfill fast and complete electron transfer. In FIG. 2B, the first photosensitive doped region 103 consists of a doped region 103a and a doped region 103b, wherein the doping concentration of the doped region 103a is lower than that of the heavily doped region 103b, so that the electron transfer is facilitated; and An energy level distribution curve 202 along line A102A102' is shown in FIG. 2B, and arrow line 202a of curve 202 shows that potentials from the first photosensitive doped region 103 of the PD to the FD region 108 are formed to fulfill fast and complete electron transfer.

3. For the full frame, namely a global shutter unit, of the large pixel unit shown in FIG. 1, the electrons generated in the first photosensitive doped region 103 of the PD need to be transferred to the storage region 106 through the first transfer transistor M1, and electrons left in the first photosensitive doped region 103 of the PD need to be removed before the next time of illumination. In order to transfer the electrons to a storage node, namely the storage region 106, potentials towards the SD, namely the storage region 106, need to be formed; in order to turn on the global shutter transistor M1 when the PD is reset, potentials from the first photosensitive doped region 103 to the first reset region 105, namely a VDD terminal, are required; and there are certain contradictions between the two cases.

Figure 2C:
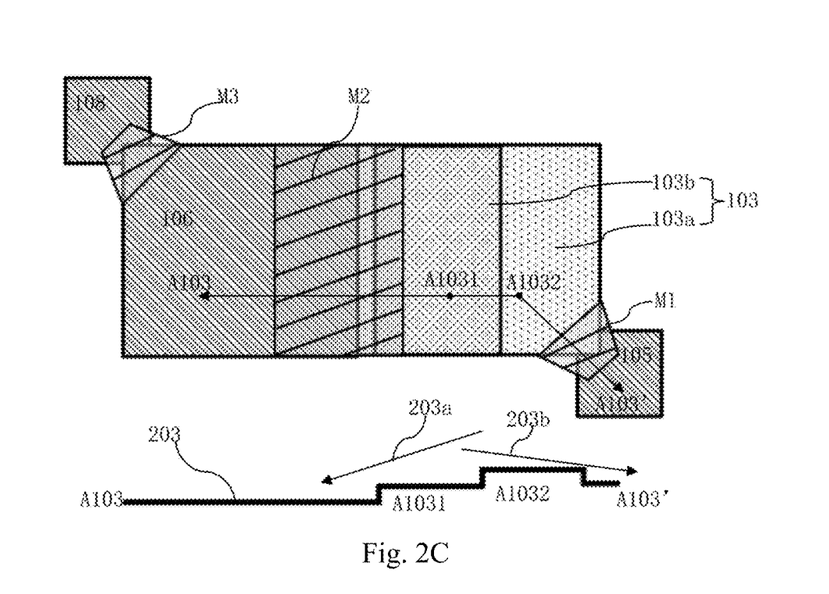
FIG. 2C is a schematic diagram of the existing large pixel unit shown in FIG. 1 from the photo diode to the floating diffusion region and from the photo diode to a first reset region.

FIG. 2C is a schematic diagram of the existing large pixel unit shown in FIG. 1 from the photo diode to the floating diffusion region and from the photo diode to the first reset region. As can be seen from FIG. 2C, the first photosensitive doped region 103 consists of a doped region 103a and a doped region 103b, wherein the doping concentration of the doped region 103a is lower than that of the heavily doped region 103b. The doped region 103b facilitates electron transfer towards the storage region 106; however, the electrons in the first photosensitive doped region 103 may not be completely removed during resetting, and consequentially, the performance of pixels is affected.

An energy level distribution curve 203 along line A103103' is shown in FIG. 2C; arrow line 203a of curve 203 shows that potentials from the first photosensitive doped region 103 of the PD to the FD region 108 can fulfill fast and complete electron transfer; however, arrow line 203b shows that there is a little difference between the potential of a node A1032 and the potential in the first reset region 105, the potential of a node A1031 is lower, and consequentially, electrons in the first photosensitive doped region 103, especially electrons in the doped region 103b corresponding to the node A1031, cannot be easily transferred to the first reset region 105.

BRIEF SUMMARY

The technical issue to be settled by the invention is to provide a global shutter CMOS image sensor, which can simultaneously and completely transfer photo-induced carriers in PDs of pixel units, especially photo-induced carriers in PDs of large pixel units, to a storage region and a first reset region, so that the overall performance of a device is improved.

To settle the above technical issue, each pixel unit of the global shutter CMOS image sensor provided by the invention includes a photo diode, a storage region and a first reset region, wherein:

The photo diode includes a semiconductor layer of a second conduction type and a first photosensitive doped region which is of a first conduction type and is formed at the top of the semiconductor layer;

The storage region is doped by the first conduction type, and a gate structure of a first transfer transistor is formed at the top of the semiconductor layer between the first photosensitive doped region and the storage region; and The first reset region is doped by the first conduction type and is connected to a supply voltage, and a gate structure of a global shutter transistor is formed at the top of the semiconductor layer between the first photosensitive doped region and the first reset region.

Inhomogeneous potentials are formed in the first photosensitive doped region through a doping structure and have a first direction towards the storage region, so that photo-induced carriers can be easily transferred to the storage region through the first transfer transistor.

The inhomogeneous potentials also have a second direction towards to the first reset region, so that photo-induced carriers left in the first photosensitive doped region can be easily transferred to the first reset region through the gate structure of the global shutter transistor during resetting.

Furthermore, a pinned layer doped by the second conduction type is formed on the surface of the first photosensitive doped region.

Furthermore, the doping structure of the first photosensitive doped region consists of a first annular doped region and an internal doped region, wherein the internal doped region is surrounded by the first annular doped region; the doping concentration of the first annular doped region is higher than that of the internal doped region, so that the inhomogeneous potentials in the first photosensitive doped region have a direction from the internal doped region to the first annular doped region; and the first direction and the second direction are both from the internal doped region to the first annular doped region.

Furthermore, the first photosensitive doped region is of a square structure when looked at from above, and the first annular doped region is of a hollow-square structure when looked at from above.

Furthermore, the internal doped region is of an annular structure or a strip-shaped structure when looked at from above.

Furthermore, the internal doped region includes two or more internal annular doped regions which are of annular structures when looked at from above, wherein the doping concentrations of the internal annular doped regions are sequentially increased towards the outside from the center of the internal doped region.

Furthermore, the internal doped region includes two or more parallel internal strip-shaped doped regions which are of strip-shaped structures when looked at from above, wherein the doping concentrations of the internal strip-shaped doped regions are sequentially increased in a direction perpendicular to the internal strip-shaped doped regions.

Furthermore, the internal doped region includes one or more internal annular doped regions which are of annular structures when looked at from above, as well as the two or more internal strip-shaped doped regions which are of strip-shaped structures when looked at from above, wherein the doping concentrations of the internal annular doped regions are sequentially increased towards the outside from the center of the internal doped region, and the doping concentrations of the parallel internal strip-shaped doped regions are sequentially increased in the direction perpendicular to the internal strip-shaped doped regions.

Furthermore, each pixel unit of the CMOS image sensor further includes a floating diffusion region, and a gate structure of a second transfer transistor is formed at the top of the semiconductor layer between the floating diffusion region and the storage region.

Furthermore, each pixel unit of the CMOS image sensor further includes a reset transistor having a gate structure arranged between the floating diffusion region and a second reset region, and the second reset region is doped by the first conduction type and is connected to the supply voltage.

Furthermore, each pixel unit of the CMOS image sensor further includes an amplifier transistor and a selection transistor, wherein the amplifier transistor has a gate connected to the floating diffusion region and a source outputting amplified signals, and the selection transistor is used for selectively outputting the amplified signals from the amplifier transistor.

Furthermore, the pixel units of the CMOS image sensor are surrounded by a shallow trench isolation structure.

Furthermore, the semiconductor layer is a silicon layer.

Furthermore, the first photosensitive doped region is an ion implantation region.

Furthermore, the first conduction type is an N type, and the second conduction type is a P type; or, the first conduction type is the P type, and the second conduction type is the N type.

According to the invention, the doping structure of the first photosensitive doped region of the photo diode of each pixel unit of the global shutter CMOS image sensor is specifically configured so that the inhomogeneous potentials are formed in the first photosensitive doped region and have a first direction towards the storage region as well as a second direction towards the first reset region, and in this way, the photo-induced carriers in the PDs of the pixel units, especially the photo-induced carriers in the PDs of the large pixel units, can be simultaneously and completely transferred to the storage region and the first reset region, and accordingly, the overall performance of the device is improved.

BRIEF DESCRIPTION OF THE DRAWINGS

The invention is further expounded as follows in combination with the drawings and specific implementations.

DETAILED DESCRIPTION

Figure 3:
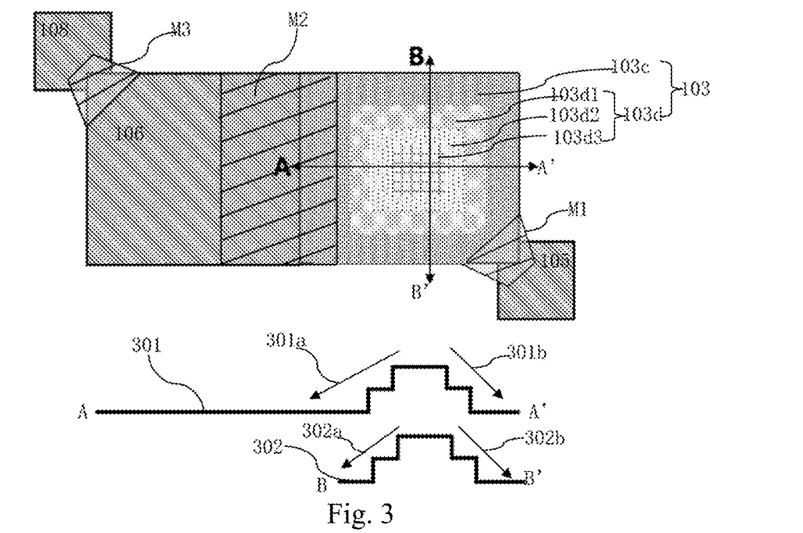
FIG. 3 is a schematic diagram of a pixel unit from a photo diode to a floating diffusion region and from the photo diode to a first reset region in a first embodiment of the invention.

Global Shutter CMOS Image Sensor in the First Embodiment of the Invention:

The global shutter CMOS image sensor in the first embodiment of the invention is of a 6T structure, and the structural view of the global shutter CMOS image sensor is shown in FIG. 1. FIG. 3 is a schematic diagram of a pixel unit from a photo diode to a floating diffusion region 108 and from the photo diode to a first reset region 105 in the first embodiment of the invention. As shown in FIG. 3, each pixel unit of the global shutter CMOS image sensor in the first embodiment of the invention includes the photo diode, a storage region 106, and a first reset region 105.

The photo diode includes a semiconductor layer 101 of a second conduction type and a first photosensitive doped region 103 which is of a first conduction type and is formed at the top of the semiconductor layer, wherein the semiconductor layer 101 is a silicon layer, and the first photosensitive doped region 103 is an ion implantation region.

The storage region 106 is doped by the first conduction type, and a gate structure of a first transfer transistor M2 is formed at the top of the semiconductor layer 101 between the first photosensitive doped region 103 and the storage region 106 by superimposition of a gate dielectric layer 110 and a polysilicon gate 111.

The first reset region 105 is doped by the first conduction type and is connected to a supply voltage VDD, and a gate structure of a global shutter transistor M1 is formed at the top of the semiconductor layer 101 between the first photosensitive doped region 103 and the first reset region 105.

Inhomogeneous potentials are formed in the first photosensitive doped region 103 through a doping structure and have a first direction towards the storage region 106, so that photo-induced carriers can be easily transferred to the storage region through the first transfer transistor M2. The inhomogeneous potentials also have a second direction towards the first reset region 105, so that photo-induced carriers left in the first photosensitive doped region 103 can be easily transferred to the first reset region 105 through the gate structure of the global shutter transistor M1 during resetting.

A pinned layer 104 doped by the second conduction type is formed on the surface of the first photosensitive doped region 103.

As shown in FIG. 3, the doping structure of the first photosensitive doped region 103 consists of a first annular doped region 103c and an internal doped region 103d, wherein the internal doped region 103d is surrounded by the first annular doped region 103c; the doping concentration of the first annular doped region 103c is higher than that of the internal doped region 103d, so that the inhomogeneous potentials in the first photosensitive doped region 103 have a direction from the internal doped region 103d to the first annular doped region 103c; and the first direction and the second direction are both from the internal doped region 103d to the first annular doped region 103c.

The first photosensitive doped region 103 is of a square structure when looked at from above, and the first annular doped region 103c is of a hollow-square structure when looked at from above.

The internal doped region 103d is of an annular structure when looked at from above. In the first embodiment of the invention, the internal doped region 103d includes two or more internal annular doped regions which are of annular structures when looked at from above, and the doping concentrations of the internal annular doped regions are sequentially increased towards the outside from the center of the internal doped region 103d; and the internal doped region 103d includes two internal doped regions 103d1 and 103d2 which are of annular structures when looked at from above, and a massive region 103d3. Energy level distribution curves along lines AA' and BB' are shown in FIG. 3. As can be seen from FIG. 3, energy levels and potentials are correspondingly distributed, and particularly, low potentials are distributed at positions having high energy levels, and high potentials are distributed at positions having low energy levels. In the first embodiment of the invention, the first conduction type is an N type, and the second conduction type is a P type; or, in other embodiments, the first conduction type is the P type, and the second conduction type is the N type. In the first embodiment of the invention, as the first conduction type is the N type and the second conduction type is the P type, the first photosensitive doped region 103 is mainly used for collecting photo-induced electrons and transferring the photo-induced electrons to the storage region 106 or to the first reset region 105. Electrons are generally transferred from high energy levels to low energy levels, that is to say, the electrons are generally transferred from low potentials to high potentials. Curve 301 in FIG. 3 is the energy level distribution curve along line AA' and corresponds to an inhomogeneous-potential structure; arrow lines 301a and 301b show that the electrons can be easily transferred from inside to outside, wherein arrow line 301a has a direction from the first photosensitive doped region 103 to the storage region 106, so that the electrons can be easily transferred from the first photosensitive doped region 103 to the storage region 106.

Similarly, curve 302 is the energy level distribution curve along line BB', and arrow lines 302a and 302b show that the electrons can be easily transferred from inside to outside. As can be seen from arrow lines 301b and 302b, the inhomogeneous potentials have a second direction towards the first reset region 105, so that photo-induced carriers left in the first photosensitive doped region 103 can be easily transferred to the first reset region 105 through the gate structure of the global shutter transistor M1 during resetting.

As shown in FIG. 1, each pixel unit of the CMOS image sensor further includes a floating diffusion region 108, and a gate structure of a second transfer transistor M3 is formed at the top of the semiconductor layer 101 between the floating diffusion region 108 and the storage region 106.

Each pixel unit of the CMOS image sensor further includes a reset transistor M4 having a gate structure arranged between the floating diffusion region 108 and a second reset region 109, and the second reset region 109 is doped by the first conduction type and is connected to the supply voltage VDD.

Each pixel unit of the CMOS image sensor further includes an amplifier transistor M5 and a selection transistor M6, wherein the amplifier transistor M5 has a gate connected to the floating diffusion region 108 and a source outputting amplified signals, and the selection transistor M6 is used for selectively outputting the amplified signals from the amplifier transistor M5.

The pixel units of the CMOS image sensor are surrounded by a shallow trench isolation structure 102.

According to the first embodiment of the invention, the doping structure of the first photosensitive doped region 103 of the photo diode of each pixel unit of the global shutter CMOS image sensor is specifically configured so that the inhomogeneous potentials are formed in the first photosensitive doped region 103 and have a first direction towards the storage region 106, as well as a second direction towards the first reset region 105, and in this way, the photo-induced carriers in the PDs of the pixel units, especially the photo-induced carriers in the PDs of the large pixel units, can be simultaneously and completely transferred to the storage region 106 and the first reset region 105, and accordingly, the overall performance of the device is improved.

Figure 4:
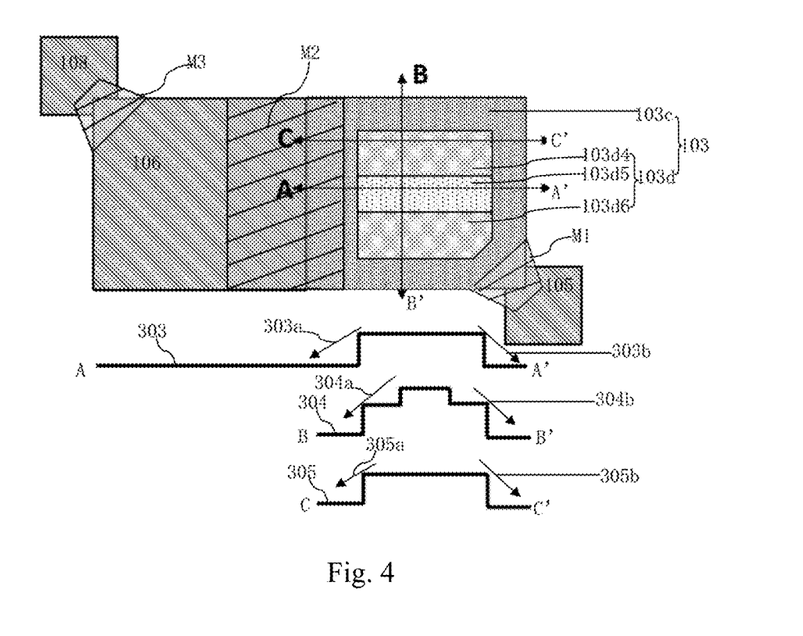
FIG. 4 is a schematic diagram of a pixel unit from a photo diode to a floating diffusion region and from the photo diode to a first reset region in a second embodiment of the invention.

Global Shutter CMOS Image Sensor in the Second Embodiment of the Invention:

The global shutter CMOS image sensor in the second embodiment differs from the global shutter CMOS image sensor in the first embodiment in the following aspects:

FIG. 4 is a schematic diagram of one pixel unit from the photo diode to the floating diffusion region and from the photo diode to the first reset region in the second embodiment of the invention. In the second embodiment of the invention, the internal doped region 103d is of a strip-shaped structure when looked at from above and includes two or more parallel internal strip-shaped doped regions which are of strip-shaped structures when looked at from above, wherein the doping concentrations of the internal strip-shaped doped regions are sequentially increased towards the outside in a direction perpendicular to the internal strip-shaped doped regions. Three internal strip-shaped doped regions 103d4, 103d5, and 103d6 are shown in FIG. 4, wherein the doping concentration of the internal strip-shaped doped region 103d5 is the lowest, the doping concentration of the internal strip-shaped doped region 103d4 is higher than that of the internal strip-shaped doped region 103d5 and is lower than that of a first annular doped region 103c, and the doping concentration of the internal strip-shaped doped region 103d6 is higher than that of the internal strip-shaped doped region 103d5, is lower than that of the first annular doped region 103c and is equal to or unequal to that of the internal strip-shaped doped region 103d4 and 103d6.

Energy level distribution curves along lines AA', BB', and CC' are shown in FIG. 4, wherein curve 303 is the energy level distribution curve along line AA', and arrow lines 303a and 303b show that electrons can be easily transferred from inside to outside, and arrow line 303a has a direction from a first photosensitive doped region 103 to a storage region 106, so that the electrons can be easily transferred from the first photosensitive doped region 103 to the storage region 106.

Curve 304 is the energy level distribution curve along line BB', and arrow lines 304a and 304b show that the electrons can be easily transferred from inside to outside.

Curve 305 is the energy level distribution curve along line CC', and arrow lines 305a and 305b show that the electrons can be easily transferred from inside to outside.

Arrow lines 303b, 304b, and 305b show that the inhomogeneous potentials have a second direction towards the first reset region 105, so that photo-induced carriers left in the first photosensitive doped region 103 can be easily transferred to the first reset region 105 through the gate structure of the global shutter transistor M1 during resetting.

Figure 5:
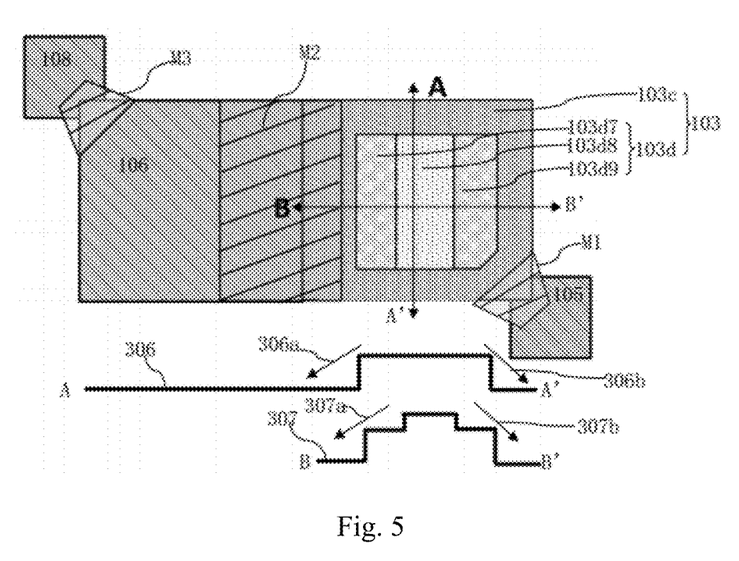
FIG. 5 is a schematic diagram of a pixel unit from a photo diode to a floating diffusion region and from the photo diode to a first reset region in a third embodiment of the invention.

Global Shutter CMOS Image Sensor in the Third Embodiment of the Invention:

The global shutter CMOS image sensor in the third embodiment differs from the global shutter CMOS image sensor in the second embodiment in the following aspects:

FIG. 5 is a schematic diagram of one pixel unit from the photo diode to the floating diffusion region and from the photo diode to the first reset region in the third embodiment of the invention. In the third embodiment of the invention, the internal doped region 103d is of a strip-shaped structure when looked at from above and includes two or more parallel internal strip-shaped doped regions which are of strip-shaped structures when looked at from above, wherein the doping concentrations of the internal strip-shaped doped regions are sequentially increased towards the outside in a direction perpendicular to the internal strip-shaped doped regions. Three internal strip-shaped doped regions 103d7, 103d8, and 103d9 are shown in FIG. 4, wherein the doping concentration of the internal strip-shaped doped region 103d8 is the lowest, the doping concentration of the internal strip-shaped doped region 103d7 is higher than that of the internal strip-shaped doped region 103d8 and is lower than that of the first annular doped region 103c, and the doping concentration of the internal strip-shaped doped region 103d9 is higher than that of the internal strip-shaped doped region 103d8 and is lower than that of the first annular doped region 103c, and the doping concentration of the internal strip-shaped doped region 103d7 is equal to or unequal to that of the internal strip-shaped doped region 103d9. Comparing FIG. 5 with FIG. 4, the internal strip-shaped doped regions 103d7, 103d8, and 103d9 in the third embodiment of the invention are perpendicular to the internal strip-shaped doped regions 103d4, 103d5, and 103d6 in the second embodiment of the invention.

Energy level distribution curves along lines AA' and BB' are shown in FIG. 5, wherein curve 306 is the energy level distribution curve along line AA', and arrow lines 306a and 306b show that electrons can be easily transferred from inside to outside.

Curve 307 is the energy level distribution curve along line BB', and arrow lines 307a and 307b show that the electrons can be easily transferred from inside to outside; and arrow line 307a has a direction from the first photosensitive doped region 103 to the storage region 106, so that the electrons can be easily transferred from the first photosensitive doped region 103 to the storage region 106.

Arrow lines 306b, and 307b show that the inhomogeneous potentials have a second direction towards a first reset region 105, so that photo-induced carriers left in the first photosensitive doped region 103 can be easily transferred to the first reset region 105 through the gate structure of the global shutter transistor M1 during resetting.

Global Shutter CMOS Image Sensor in the Fourth Embodiment of the Invention:

The global shutter CMOS image sensor in the fourth embodiment differs from the global shutter CMOS image sensor in the first embodiment in the following aspects:

The internal doped region 103d includes one or more internal annular doped regions which are of annular structures when looked at from above, as well as two or more internal strip-shaped doped regions which are of strip-shaped structures when looked at from above, wherein the doping concentrations of the internal annular doped regions are sequentially increased towards the outside from the center of the internal doped regions 103d, and the doping concentrations of the parallel internal strip-shaped doped regions are sequentially increased towards the outside in a direction perpendicular to the internal strip-shaped doped regions. The fourth embodiment of the invention can be obtained through the combination of the first embodiment and the second embodiment of the invention or through the combination of the first embodiment and the third embodiment of the invention. For instance, the structure in the fourth embodiment of the invention can be obtained by replacing the massive region shown in FIG. 3 with the internal strip-shaped doped region 103d shown in FIG. 4 or the internal strip-shaped doped region shown in FIG. 5.

The above embodiments are used for expounding the invention, but are not used for limiting the invention. Those skilled in this field can make various transformations and improvements without deviating from the principle of the invention, and all these transformations and improvements should also fall within the protection scope of the invention.

What is claimed is:

1. A global shutter CMOS image sensor, wherein each pixel unit of the global shutter CMOS image sensor comprises a photo diode, a storage region, and a first reset region, wherein:

the photo diode comprises a semiconductor layer of a second conduction type and a first photosensitive doped region which is of a first conduction type and is formed at a top of the semiconductor layer;

the storage region is doped by the first conduction type, and a gate structure of a first transfer transistor is formed at the top of the semiconductor layer between the first photosensitive doped region and the storage region;

the first reset region is doped by the first conduction type and is connected to a supply voltage, and a gate structure of a global shutter transistor is formed at the top of the semiconductor layer between the first photosensitive doped region and the first reset region;

inhomogeneous potentials are formed in the first photosensitive doped region through a doping structure and have a first direction towards the storage region, so that photo-induced carriers can be easily transferred to the storage region through the first transfer transistor;

the inhomogeneous potentials also have a second direction towards the first reset region, so that photo-induced carriers left in the first photosensitive doped region can be easily transferred to the first reset region through the gate structure of the global shutter transistor during resetting, the doping structure of the first photosensitive doped region consists of a first annular doped region and an internal doped region, wherein the internal doped region is surrounded by the first annular doped region; a doping concentration of the first annular doped region is higher than that of the internal doped region, so that the inhomogeneous potentials in the first photosensitive doped region have a direction from the internal doped region to the first annular doped region; and the first direction and the second direction are both from the internal doped region to the first annular doped region.

2. The global shutter CMOS image sensor according to claim 1, wherein a pinned layer doped by the second conduction type is formed on a surface of the first photosensitive doped region.

3. The global shutter CMOS image sensor according to claim 1, wherein the first photosensitive doped region is of a square structure when looked at from above, and the first annular doped region is of a hollow-square structure when looked at from above.

4. The global shutter CMOS image sensor according to claim 1, wherein the internal doped region is of an annular structure when looked at from above.

5. The global shutter CMOS image sensor according to claim 4, wherein the internal doped region comprises two or more internal annular doped regions which are of annular structures when looked at from above, and doping concentrations of the internal annular doped regions are sequentially increased towards the outside from a center of the internal doped region.

6. The global shutter CMOS image sensor according to claim 1, wherein the internal doped region comprises two or more parallel internal strip-shaped doped regions which are of strip-shaped structures when looked at from above, and doping concentrations of the internal strip-shaped doped regions are sequentially increased towards the outside in a direction perpendicular to the internal strip-shaped doped regions.

7. The global shutter CMOS image sensor according to claim 1, wherein the internal doped region comprises one or more internal annular doped regions which are of annular structures when looked at from above, as well as two or more parallel internal strip-shaped doped regions which are of strip-shaped structures when looked at from above, wherein doping concentrations of the internal annular doped regions are sequentially increased towards the outside from a center of the internal doped region, and doping concentrations of the parallel internal strip-shaped doped regions are sequentially increased towards the outside in a direction perpendicular to the internal strip-shaped doped regions.

8. The global shutter CMOS image sensor according to claim 2, wherein each said pixel unit of the global shutter CMOS image sensor further comprises a floating diffusion region, and a gate structure of a second transfer transistor is formed at a top of the semiconductor layer between the floating diffusion region and the storage region.

9. The global shutter CMOS image sensor according to claim 8, wherein each said pixel unit of the global shutter CMOS image sensor further comprises a reset transistor having a gate structure arranged between the floating diffusion region and a second reset region, and the second reset region is doped by the first conduction type and is connected to the supply voltage.

10. The global shutter CMOS image sensor according to claim 9, wherein each said pixel unit of the global shutter CMOS image sensor further comprises an amplifier transistor and a selection transistor, wherein the amplifier transistor has a gate connected to the floating diffusion region and a source outputting amplified signals, and the selection transistor is used for selectively outputting the amplified signals from the amplifier transistor.

11. The global shutter CMOS image sensor according to claim 1, wherein pixel units of the global shutter CMOS image sensor are surrounded by a shallow trench isolation structure.

12. The global shutter CMOS image sensor according to claim 1, wherein the semiconductor layer is a silicon layer.

13. The global shutter CMOS image sensor according to claim 1, wherein the first photosensitive doped region is an ion implantation region.

14. The global shutter CMOS image sensor according to claim 1, wherein the first conduction type is an N type, and the second conduction type is a P type; or, the first conduction type is the P type, and the second conduction type is the N type.

15. The global shutter CMOS image sensor according to claim 1, wherein the internal doped region is of a strip-shaped structure when looked at from above.

* * * * *